United States Patent
Rinner et al.

(10) Patent No.: US 8,823,245 B2
(45) Date of Patent: Sep. 2, 2014

(54) SOLDER MATERIAL FOR FASTENING AN OUTER ELECTRODE ON A PIEZOELECTRIC COMPONENT AND PIEZOELECTRIC COMPONENT COMPRISING A SOLDER MATERIAL

(75) Inventors: Franz Rinner, Deutschlandsberg (AT); Markus Weiglhofer, Werndorf (AT); Marion Ottlinger, Deutschlandsberg (AT); Reinhard Gabl, St. Peter (AT); Martin Galler, Graz (AT); Christoph Auer, Graz (AT); Georg Kuegerl, Eibiswald (AT)

(73) Assignee: Epcos AG, Munich (DE)

( * ) Notice: Subject to any disclaimer, the term of this patent is extended or adjusted under 35 U.S.C. 154(b) by 93 days.

(21) Appl. No.: 13/509,521

(22) PCT Filed: Nov. 22, 2010

(86) PCT No.: PCT/EP2010/067942
§ 371 (c)(1),
(2), (4) Date: Jul. 27, 2012

(87) PCT Pub. No.: WO2011/061335
PCT Pub. Date: May 26, 2011

(65) Prior Publication Data
US 2012/0280593 A1 Nov. 8, 2012

(30) Foreign Application Priority Data
Nov. 20, 2009 (DE) .......................... 10 2009 054 068

(51) Int. Cl.
*H01L 41/083* (2006.01)
*B23K 35/00* (2006.01)
*H01L 41/293* (2013.01)
*H01L 41/047* (2006.01)
*B23K 35/26* (2006.01)

(52) U.S. Cl.
CPC ............. *B23K 35/262* (2013.01); *B23K 35/001* (2013.01); *H01L 41/293* (2013.01); *H01L 41/0472* (2013.01)
USPC ........................................................ 310/328

(58) Field of Classification Search
USPC .................................................. 310/328, 334
See application file for complete search history.

(56) References Cited

U.S. PATENT DOCUMENTS

| 3,361,561 | A |   | 1/1968  | Pinter |
| 3,481,795 | A |   | 12/1969 | Lane |
| 5,411,602 | A | * | 5/1995  | Hayes ............................... 148/23 |
| 5,736,074 | A | * | 4/1998  | Hayes et al. ....................... 264/6 |
| 6,208,026 | B1| * | 3/2001  | Bindig et al. .................. 257/718 |
| 6,319,617 | B1|   | 11/2001 | Jin et al. |
| 6,669,077 | B1| * | 12/2003 | Tanaka et al. ............ 228/180.21 |

(Continued)

FOREIGN PATENT DOCUMENTS

| DE | 613878 A    | 5/1935 |
| DE | 2054542 A1  | 5/1972 |

(Continued)

*Primary Examiner* — J. San Martin
(74) *Attorney, Agent, or Firm* — Slater & Matsil, L.L.P.

(57) ABSTRACT

A solder material can be used for fastening an outer electrode on a piezoelectric component. The solder material contains tin as the main constituent and at least one addition from the group of cobalt, tungsten, osmium, titanium, vanadium, iron and rare earth metals. A piezoelectric component includes such a solder material. The solder material is applied by means of a base metallization.

20 Claims, 2 Drawing Sheets

(56) References Cited

U.S. PATENT DOCUMENTS

| | | | |
|---|---|---|---|
| 6,850,084 B2 * | 2/2005 | Hembree | 324/754.04 |
| 7,560,371 B2 * | 7/2009 | Dando et al. | 438/612 |
| 2007/0257598 A1 | 11/2007 | Yamada et al. | |
| 2008/0070059 A1 * | 3/2008 | Takaoka et al. | 428/647 |
| 2008/0160331 A1 | 7/2008 | Kukimoto et al. | |
| 2008/0290142 A1 | 11/2008 | Hougham et al. | |
| 2009/0065097 A1 | 3/2009 | Chen | |

FOREIGN PATENT DOCUMENTS

| | | |
|---|---|---|
| DE | 101 15 482 A1 | 10/2002 |
| DE | 10 2006 049 323 A1 | 4/2008 |
| EP | 0 612 577 A1 | 8/1994 |
| EP | 1 048 392 A1 | 11/2000 |
| EP | 1 080 823 A2 | 3/2001 |
| EP | 1 088 615 A2 | 4/2001 |
| EP | 1 106 301 A1 | 6/2001 |
| EP | 1 213 089 A1 | 6/2002 |
| EP | 0 844 678 B1 | 8/2002 |
| GB | 1 515 135 A | 6/1978 |
| JP | 01-095893 A | 4/1989 |
| JP | 06-344180 A | 12/1994 |
| JP | 10-180480 A | 7/1998 |
| JP | 2000-102894 A | 4/2000 |
| JP | 2003-001483 A | 1/2003 |
| JP | 2005-246480 A | 9/2005 |
| JP | 2005319470 A | 11/2005 |
| JP | 2007165394 A | 6/2007 |
| JP | 2009218270 A | 9/2009 |
| KR | 10-2005-0040099 A | 5/2005 |
| WO | WO 96/19314 A1 | 6/1996 |
| WO | WO 2008/046406 A1 | 4/2008 |

\* cited by examiner

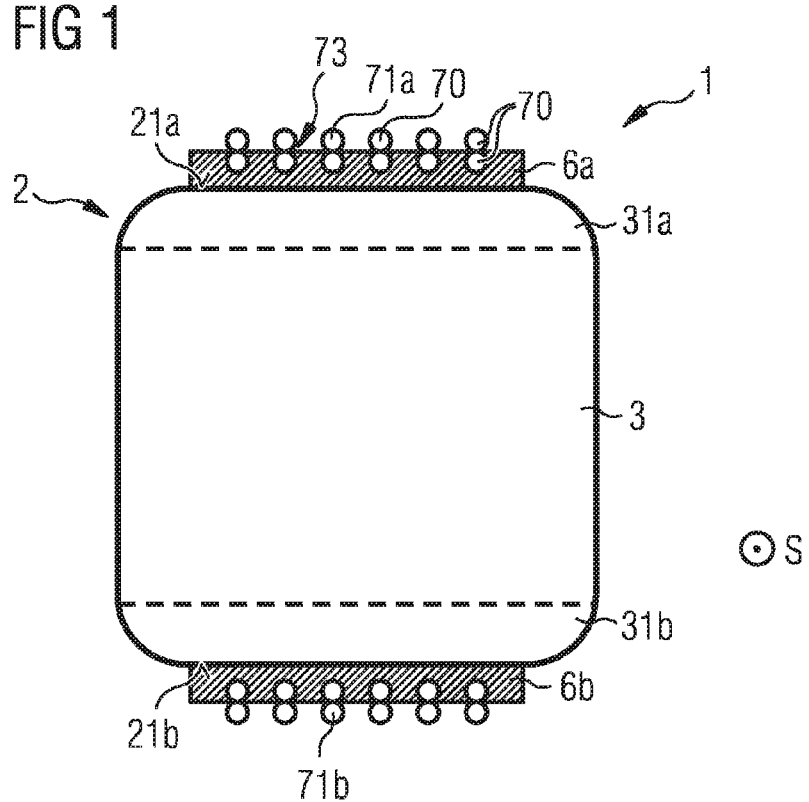
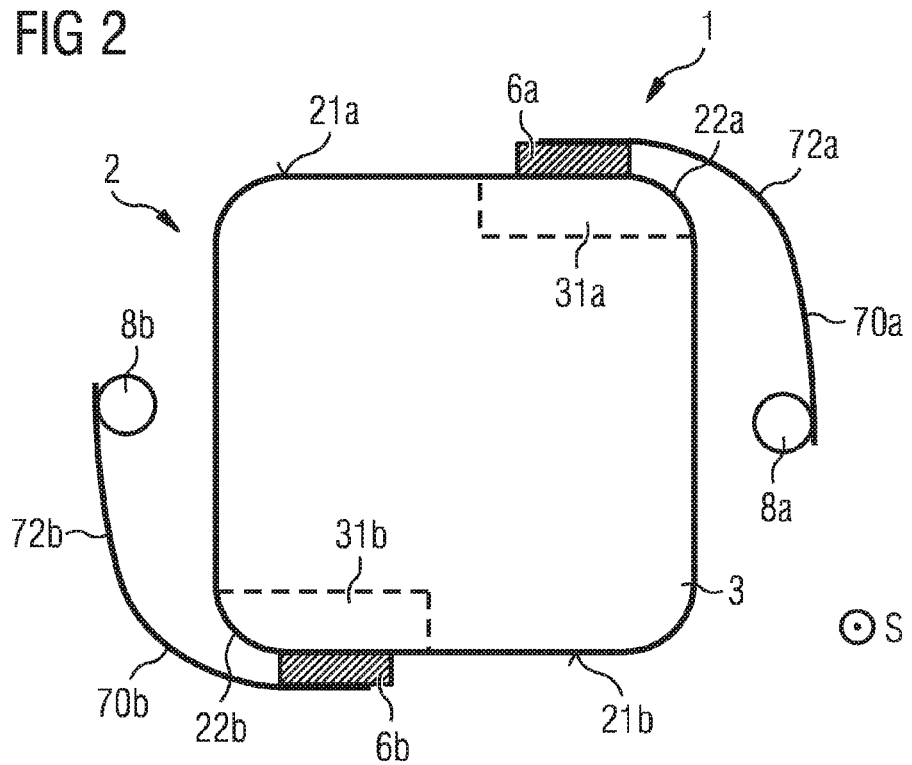

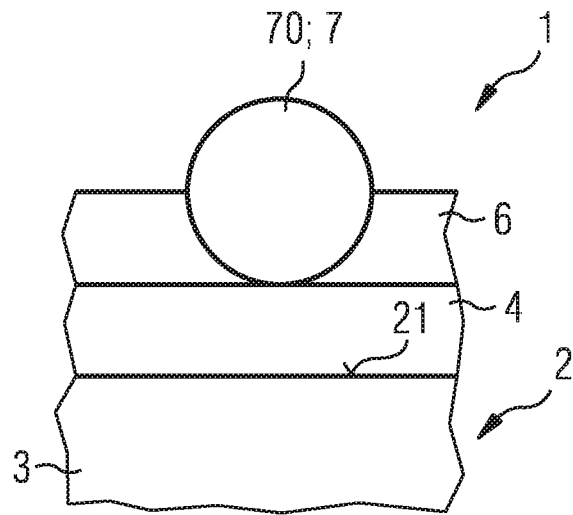
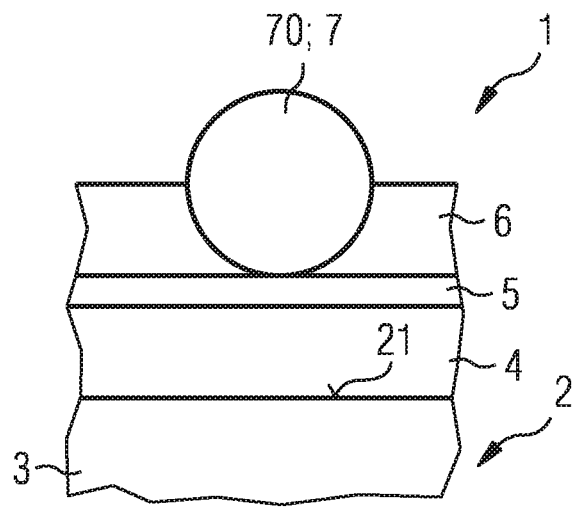

SOLDER MATERIAL FOR FASTENING AN OUTER ELECTRODE ON A PIEZOELECTRIC COMPONENT AND PIEZOELECTRIC COMPONENT COMPRISING A SOLDER MATERIAL

This patent application is a national phase filing under section 371 of PCT/EP2010/067942, filed Nov. 22, 2010, which claims the priority of German patent application 10 2009 054 068.7 filed Nov. 20, 2009, each of which is incorporated herein by reference in its entirety.

TECHNICAL FIELD

Embodiments of the invention specify a solder material for fastening an outer electrode in a piezoelectric component. A component of this type is, for example, a piezo actuator, which can be used to operate an injection valve in a motor vehicle.

BACKGROUND

European patent publication EP 0844678 B1 specifies a piezo actuator in which an outer electrode is soldered onto a base metallization.

SUMMARY OF THE INVENTION

One embodiment of the invention specifies a solder material for fastening an outer electrode in a piezoelectric component, with which it is possible to fasten the outer electrode as reliably and permanently as possible. The solder material contains tin as the main constituent and at least one addition from the group consisting of cobalt, tungsten, osmium, titanium, vanadium, iron and rare earth metals.

By using such a tin solder, it is possible to achieve a reliable bond of an outer electrode in a piezoelectric component. This is required especially in the case of a piezoelectric component in which mechanical stresses can lead to detachment of the outer electrode.

By way of example, the solder material is suitable for fastening an outer electrode in a piezo actuator. A piezo actuator has a main body, which expands during operation when an electrical voltage is applied. In this case, mechanical stresses and cracks may form on the outer side of the main body. The fastening of an outer electrode on the main body has to withstand these loads, such that an electrical contact connection of the component is ensured.

By way of example, the piezo actuator is produced with a multi-layered construction. The main body has piezoelectric layers stacked one above another and electrode layers arranged therebetween. The piezoelectric layers are formed, for example, from a ceramic material, and the electrode layers are formed from a copper paste, a silver paste or a silver-palladium paste. It is preferable for the piezoelectric layers and the electrode layers to be sintered jointly, and therefore they form a monolithic sintered body.

It is preferable for base metallizations to be applied to the outer side of the main body for making electrical contact with the electrode layers. By way of example, base metallizations are provided on two, opposing side faces of the main body. The electrode layers preferably alternately reach up to one of the base metallizations, and are set back into the stack with reference to the opposing base metallization. In this way, an electrical voltage can be applied between neighboring electrode layers by means of the base metallizations.

The base metallizations are formed, for example, from burnt-in pastes, which can contain copper or silver-palladium as the main constituent. In addition, the pastes can contain a glass flux proportion, for example in the form of lead oxide or silicon dioxide, as a result of which a particularly stable bond to a sintered main body can be established.

In one embodiment, the solder material has such a composition that it bonds reliably to a base metallization and brings about no or only little dealloying of the base metallization. In this case, the solder material can be applied directly to the base metallization. Diffusion processes in the solder material should be slowed by the indicated additions of suitable, high-melting metals such as cobalt, tungsten, osmium, titanium, vanadium, iron and rare earth metals. The additions can serve as crystallization nuclei during the solidification of the solder material, and thus lead to a fine-grained microstructure. In this way, it is possible to avoid in particular the diffusion of the tin in the direction of the base metallization and a chemical reaction between the tin and the material of the base metallization.

In a preferred embodiment, the solder material contains an addition of cobalt. It has been found that the use of cobalt makes it possible to achieve a particularly reliable bond of the solder material.

The proportion of the addition is preferably between 0.03% by weight and 0.17% by weight.

In one embodiment, the solder material contains at least one further addition from the group consisting of silver, copper, nickel and antimony. By virtue of additions of this type, it is possible to set the melting point of the solder material, the brittleness and the wetting properties.

Furthermore, the solder material used has a high temperature stability. The temperature stability can be set, for example, by the silver and copper additions.

By way of example, the solder material contains a silver addition in a proportion of between 2.5% by weight and 3.5% by weight. In addition or as an alternative thereto, the solder material can contain a copper addition in a proportion of between 0.3% by weight and 0.7% by weight.

A preferred solder material contains tin as the main constituent, a silver addition in a proportion of between 2.5% by weight and 3.5% by weight, a copper addition in a proportion of between 0.3% by weight and 0.7% by weight and a cobalt addition in a proportion of between 0.03% by weight and 0.17% by weight. By way of example, use is made of an SnAg3Cu0.5Co0.1 solder material, in which the desired value of silver is 3.0% by weight, the desired value of copper is 0.5% by weight, the desired value of cobalt is 0.1% by weight and the remainder of the material is formed by tin.

It is preferable for the solder material to be free from lead. In particular, it should comply with the so-called RoHS directive of the European Union relating to the restriction of the use of specific dangerous substances in electrical and electronic appliances.

In another embodiment, a piezoelectric component comprises such a solder material. The component has a main body of piezoelectric layers and electrode layers arranged therebetween. A base metallization is applied to at least one outer side of the main body. The solder material is applied over the base metallization.

It is preferable for an outer electrode to be fastened to the main body of the component by means of the solder material. By way of example, the outer electrode is in the form of a wire mesh. In a further embodiment, the outer electrode is in the form of a so-called wire harp, in which wires arranged parallel are fastened to the main body and lead to a further contact connection which is arranged at a distance from the main body.

In one embodiment, the solder material is applied directly to the base metallization. This makes particularly cost-effective production of the component possible.

In an alternative embodiment, a coating, which preferably improves the wetting of the solder material, is applied to the base metallization. The solder material is applied to the coating. In this way, a particularly reliable soldered connection can be established.

A coating of this type can be applied to the base metallization by means of a sputtering process. The coating contains, for example, metals from the group consisting of silver, nickel, chromium and copper.

To fasten an outer electrode to the main body, the outer electrode is placed onto the base metallization or onto a coating on the base metallization. By way of example, the outer electrode is coated with the solder material. After the outer electrode has been placed onto the main body, the solder material is heated so that it softens and forms an integral bond with the base metallization or the coating. It is preferable for the outer electrode to be pressed against the base metallization during the soldering process, in order to achieve a space-saving and reliable soldered connection.

BRIEF DESCRIPTION OF THE DRAWINGS

Hereinbelow, the specified component and possible uses of the solder material are explained with reference to schematic figures which are not true to scale and in which:

FIG. 1 shows a cross section through a piezoelectric component with an outer electrode in the form of a wire mesh;

FIG. 2 shows a cross section through a piezoelectric component with an outer electrode in the form of a wire harp;

FIG. 3 shows, in cross section, a first embodiment of the fastening of an outer electrode in a piezoelectric component; and FIG. 4 shows, in cross section, a second embodiment of the fastening of an outer electrode in a piezoelectric component.

The following list of reference symbols can be used in conjunction with the drawings:

1 Piezoelectric component
2 Main body
21, 21a, 21b Outer side
22a, 22b Edge
3 Piezoelectric layer
31a, 31b Inactive zone
4 Base metallization
5 Coating
6 Solder material
70, 70a, 70b Wire
71, 71a, 71b Wire mesh
72, 72a, 72b Wire harp
73 Intersection
8a, 8b Contact pin
S Stacking direction

DETAILED DESCRIPTION OF ILLUSTRATIVE EMBODIMENTS

FIG. 1 shows a cross section through a piezoelectric component 1 in the form of a piezo actuator. The component 1 has a main body 2 of piezoelectric layers 3 and electrode layers (not visible here) that are stacked one above another. The piezoelectric layers 3 and electrode layers are stacked one above another along a stacking direction S and are sintered jointly. The main body 2 has a longitudinal axis which corresponds to the stacking direction S.

The piezoelectric layers 3 are produced using, for example, thin films of a piezoceramic material, such as lead zirconate titanate (PZT). To form the electrode layers, a metal paste, e.g., a copper paste or a silver-palladium paste, can be applied to the films in a screen printing process. The films are then stacked, pressed and sintered jointly.

The electrode layers extend along the stacking direction S alternately up to an outer side 21a, 21b of the main body 2, and are spaced apart from the other outer side 21b, 21a. In this way, so-called inactive zones 31a, 31b are formed in the main body 2. Electrode layers of different polarity that are adjacent in the stacking direction S do not overlap in the inactive zones 31a, 31b. In the inactive zones 31a, 31b, only a small expansion or no expansion at all of the component 1 takes place when an electrical voltage is applied.

Outer electrodes in the form of wire meshes 71a, 71b are applied to opposing outer sides 21a, 21b of the main body 2 in a manner adjoining the inactive zones 31a, 31b. The wire meshes 71a, 71b are each fastened to a base metallization (not shown here) on the outer side 21a, 21b of the main body 2 by means of a solder material 6a, 6b.

The wire meshes 71a, 71b comprise a multiplicity of interwoven wires 70, which run at angles of 45° to the stacking direction S. The wires 70 comprise steel as the base material and are provided with a copper coating. In the sectional view shown, it is possible to see intersections 73, at which the wires 70 intersect at an angle of 90°.

In the exemplary embodiment shown here, the wire mesh 71a, 71b is soldered to the base metallization 4 over the entire surface thereof. This means that solder material 6a, 6b, which establishes the bond to the base metallization 4, is located at least in certain regions on all wire portions of the wire mesh 71a, 71b. In particular, the solder material 6a, 6b is located at least on partial regions of the wire portions which face toward the base metallization 4.

The solder material 6a, 6b contains tin as the main constituent and an addition of cobalt. Furthermore, in addition to tin as the main constituent, the solder material 6a, 6b contains a silver addition in a proportion of between 2.5% by weight and 3.5% by weight, a copper addition in a proportion of between 0.3% by weight and 0.7% by weight and a cobalt addition in a proportion of 0.03% by weight to 0.17% by weight.

By virtue of additions of this type, dealloying of the base metallization by the solder material 6a, 6b can be reduced. In particular, the diffusion of the tin toward the base metallization can be slowed, and a reaction between the tin and the base metallization can thus be prevented. In addition, it is possible to achieve a reliable bond between the solder material 6a, 6b and the base metallization.

FIG. 2 shows a further embodiment for an outer electrode in a piezoelectric component 1 in the form of a piezo actuator.

The main body 2 has piezoelectric layers 3 and electrode layers (not visible here) which are stacked one above another. The electrode layers are led alternately up to an edge 22a, 22b of the main body 2 and are spaced apart from the diagonally opposing edge 22b, 22a, such that the inactive zones 31a, 31b are located in the region of the opposing edges 22a, 22b. For making electrical contact with the inner electrodes, base metallizations (not visible here) are applied to two opposing outer sides 21a, 21b, in a manner adjoining the inactive zones 22a, 22b. The base metallizations extend in the form of narrow strips along the stacking direction S of the main body 2.

A solder material 6a, 6b, by means of which outer electrodes in the form of wire harps 72a, 72b are fastened to the main body 2, is applied over each base metallization. Each of the wire harps 72a, 72b has a multiplicity of parallel wires 70a, 70b, which are guided around an edge 22a, 22b of the main body 2. The wire harps 72a, 72b are connected at the free ends thereof to further contact connections in the form of contact pins 8a, 8b.

The solder material 6a, 6b comprises tin as the main constituent and at least one addition from the group consisting of cobalt, tungsten, osmium, titanium, vanadium, iron and rare earth metals.

FIG. 3 shows, in detail, a first embodiment for the fastening of an outer electrode 7 in a piezoelectric component 1. The component 1 is a piezo actuator, as shown by way of example in FIG. 1 or FIG. 2.

An outer electrode 7 having a multiplicity of wires 70 is fastened to the main body 2 of the component 1. By way of example, the outer electrode 7 can be in the form of a wire mesh 71a, 71b, as shown in FIG. 1, or in the form of a wire harp 72a, 72b, as shown in FIG. 2.

A base metallization 4 is applied to the outer side 21 of the main body 2. The base metallization 4 is formed from a burnt-in copper paste containing a glass flux proportion. By virtue of partial diffusion of the glass flux proportion into the piezoelectric layers 3 and the electrode layers, it is possible to achieve a particularly solid connection to the main body 2. By way of example, the base metallization 4 has a thickness in the range of 20 to 50 µm.

The wires 70 of the outer electrode 7 are fastened to the base metallization 4 by means of the solder material 6. The solder material 6 is applied over the base metallization 4 and directly adjoins the base metallization 4. As the outer electrode 7 is being fastened to the main body 2, the wires 70 are pressed against the main body 2. This makes it possible to achieve particularly reliable fastening of the wires 70. As a result, the wires 70 lie at least partially directly on the base metallization 4, and are covered in lateral regions by solder material 6. In one embodiment, solder material 6 is applied to all wire portions of the wires 70 at least in a partial region which faces toward the base metallization 4, as a result of which the wires 70 are fastened over the entire surface thereof to the base metallization.

In a further embodiment, a continuous layer of solder can be applied to the base metallization. In this case, the wires are not in direct contact with the base metallization.

In a further embodiment, the wires lift off from the base metallization in certain regions, and an interspace which is not filled with solder material is present between the wires and the base metallization. In this way, the deformability of the outer electrode can be increased.

FIG. 4 shows a further embodiment for the fastening of an outer electrode 7 in a piezoelectric component 1.

Here, a continuous coating 5 is applied to the base metallization 4. The outer electrode 7 is fastened to the coating 5 by means of the solder material 6. The coating 5 is, for example, a sputtered layer of silver, nickel, chromium or copper and has a thickness in the range of 0.1 µm to 1 µm, for example of 0.3 µm.

The coating 5 has particularly good soldering properties, and therefore the solder material 6 can be fastened very reliably to the coating 5.

As the outer electrode 7 is being fastened to the main body 2, a base metallization 4, for example a copper paste or a silver-palladium paste, is applied to the main body 2 and burned in, for example. Then, a coating 5 is applied to the base metallization 4 by means of a sputtering process. The outer electrode 7 is placed onto the coating 5 and soldered thereto.

The invention claimed is:

1. A piezoelectric component comprising:
   a main body that includes piezoelectric layers and electrode layers arranged between the piezoelectric;
   a base metallization at an outer side of the main body;
   a solder material overlying the base metallization, the solder material comprising tin as the main constituent and at least one addition selected from the group consisting of cobalt, tungsten, osmium, titanium, vanadium, iron and rare earth metals; and
   a coating disposed between the base metallization and the solder material.

2. The piezoelectric component according to claim 1, wherein the solder material is free from lead.

3. The piezoelectric component according to claim 1, wherein the solder material is applied directly to the base metallization.

4. The piezoelectric component according to claim 1, wherein the coating comprises a material configured to improve wetting of the solder material to the base metallization.

5. The piezoelectric component according to claim 1, further comprising an outer electrode that is secured to the base metallization by the solder material.

6. The piezoelectric component according to claim 5, wherein the outer electrode comprises a wire mesh.

7. The piezoelectric component according to claim 5, wherein the outer electrode comprises a wire harp.

8. The piezoelectric component according to claim 1, wherein the proportion of the at least one addition in the solder material is between 0.03% by weight and 0.17% by weight.

9. The piezoelectric component according to claim 1, wherein the solder material further comprises at least one further addition selected from the group consisting of silver, copper, nickel and antimony.

10. The piezoelectric component according to claim 9, wherein the at least one further addition comprises a silver addition in a proportion of between 2.5% by weight and 3.5% by weight and a copper addition in a proportion of between 0.3% by weight and 0.7% by weight.

11. The piezoelectric component according to claim 9, wherein the at least one further addition comprises a silver addition in a proportion of between 2.5% by weight and 3.5% by weight.

12. The piezoelectric component according to claim 9, wherein the at least one further addition comprises a copper addition in a proportion of between 0.3% by weight and 0.7% by weight.

13. The piezoelectric component according to claim 1, wherein the at least one addition comprises tungsten.

14. The piezoelectric component according to claim 1, wherein the at least one addition comprises osmium.

15. The piezoelectric component according to claim 1, wherein the at least one addition comprises titanium.

16. The piezoelectric component according to claim 1, wherein the at least one addition comprises vanadium.

17. A piezoelectric component comprising:
   a main body that includes piezoelectric layers and electrode layers arranged between the piezoelectric;
   a base metallization at an outer side of the main body, wherein the base metallization is formed from a burnt-in paste: and
   a solder material overlying the base metallization, the solder material comprising tin as the main constituent and at least one addition selected from the group consisting of cobalt, tungsten, osmium, titanium, vanadium, iron and rare earth metals.

18. The piezoelectric component according to claim 17, further comprising a coating disposed between the base metallization and the solder material.

19. The piezoelectric component according to claim 17, wherein the burnt-in paste comprises a metal as the main constituent, wherein the metal is selected from the group consisting of copper, silver and silver-palladium.

20. A piezoelectric component comprising:
- a main body that includes piezoelectric layers and electrode layers arranged between the piezoelectric;
- a base metallization at an outer side of the main body; and
- a solder material overlying the base metallization, the solder material comprising tin as the main constituent, wherein the solder material contains a silver addition in a proportion of between 2.5% by weight and 3.5% by weight, a copper addition in a proportion of between 0.3% by weight and 0.7% by weight and a cobalt addition in a proportion of between 0.03% by weight and 0.17% by weight.

\* \* \* \* \*